United States Patent [19]

Lee

[11] 4,374,390
[45] Feb. 15, 1983

[54] DUAL-WAVELENGTH LIGHT-EMITTING DIODE

[75] Inventor: Tien P. Lee, Holmdel, N.J.

[73] Assignee: Bell Telephone Laboratories, Incorporated, Murray Hill, N.J.

[21] Appl. No.: 185,666

[22] Filed: Sep. 10, 1980

[51] Int. Cl.$^3$ ............... H01L 29/06; H01L 33/00
[52] U.S. Cl. .................................. 357/17; 357/16; 357/20; 357/55; 357/61
[58] Field of Search ............... 357/17, 20, 16, 55, 357/61

[56] References Cited

U.S. PATENT DOCUMENTS

| | | | |
|---|---|---|---|
| 3,537,029 | 10/1970 | Kressel et al. ................ | 331/94.5 |
| 3,891,993 | 6/1975 | Boneking ........................ | 357/190 R |
| 4,032,944 | 6/1977 | van Dongen et al. ........ | 357/170 R |
| 4,163,953 | 8/1979 | Springthorpe et al. ....... | 357/18 X |
| 4,297,720 | 10/1981 | Nishizawa et al. ............ | 357/16 X |

OTHER PUBLICATIONS

S. Sakai, T. Aoki and Y. Amoniya, "A New InGaAsP-/InP Dual-Wavelength LED", *Applied Physics Letters*, vol. 35, No. 8, (1979), pp. 588–589.

J. C. Campbell, T. P. Lee, A. G. Dentai and C. A. Bumes, "Dual-Wavelength Demultiplexing InGaAsP Photodiode", *Applied Physics Letters*, vol. 34, No. 6, (1979), pp. 401–402.

*Primary Examiner*—William L. Sikes
*Assistant Examiner*—J. Carroll
*Attorney, Agent, or Firm*—Daniel D. Dubosky; Michael J. Urbano

[57] ABSTRACT

A dual-wavelength light-emitting diode (10) is disclosed wherein at least two quaternary layers (102 and 104) are epitaxially grown on indium phosphide substrate (100) and a top indium phosphide layer (105) of the opposite conductivity type is grown to establish a junction (121) in the topmost quaternary layer. An isolation channel (106) cuts through the epitaxial layers and divides the device into two separate regions. A dopant is diffused into one of the regions in order to establish a pn junction (122) in the bottom quaternary layer. Independent electrical contacts (107 and 108) bonded to the top indium phosphide layer in each of the regions establish an electrical connection to pn junctions in each of the two separate regions. The device can be effectively heat sinked by mounting the epitaxial layer side of the substrate to a beryllium oxide heat sink (200) onto which gold bonding pads (201 and 202) have been plated.

10 Claims, 4 Drawing Figures

DUAL-WAVELENGTH LIGHT-EMITTING DIODE

BACKGROUND OF THE INVENTION

This invention relates to light-emitting diodes and, more particularly, to light-emitting diodes that are capable of emitting two separate wavelengths.

The very wide transmission window from about 0.8 microns to 1.6 microns in present low-loss optical fibers permits the use of wavelength multiplexing to increase the transmission capacity of a single fiber. Dual-wavelength photodetectors that are capable of operating within this wavelength range have already been disclosed in the prior art. See, for example, the article entitled "Dual Wavelength Demultiplexing InGaAsP Photodiode" by J. C. Campbell et al, *Applied Physics Letters*, Vol. 34, No. 6, March 15, 1979, pp. 401–402. Independent light-emitting diodes have already been proposed for use in connection with this two wavelength demultiplexing photodetector in order to provide transmission systems having greater information carrying capacity.

A single device, dual-wavelength light emitting diode has been disclosed in the prior art in the article entitled "A New InGaAsP/InP Dual-Wavelength LED" by S. Sakai et al., *Applied Physics Letters*, Vol. 35, No. 8, Oct. 15, 1979, pp. 588–589. In this Sakai et al dual wavelength LED, five layers including two quaternary layers are epitaxially grown on an indium phosphide substrate and approximately one half of the device is removed by chemical etching in order to permit a direct electrical connection to the bottom quaternary layer. The resulting device shown in FIG. 1 of the article presents an irregular top surface that cannot be readily attached to any heat sink material. The device shown in the Sakai et al article was attached to a copper heat sink, but as pointed out in the article, the output of the light-emitting junction in the uppermost quaternary layer began to saturate at 40 milliamps because of the high resistance and poor heat sink. Although it is not stated, this heat sink was very likely bonded to the substrate surface that is opposite to that of the epitaxial layers. As implied by this article, a higher output could be obtained from the light-emitting junction if the device had better heat sinking.

SUMMARY OF THE INVENTION

In accordance with the present invention at least two quaternary layers are epitaxially grown on an indium phosphide substrate and a top layer of indium phosphide having the opposite conductivity is epitaxially grown on the uppermost quaternary layer, thereby establishing a pn junction in the top or uppermost quaternary layer. An isolation channel is cut through the quaternary layers in order to separate the device into two separate regions. By masking one of the regions, a dopant of the opposite conductivity type is diffused into the other region so as to establish a pn junction in the bottom quaternary layer. An electrical contact is established with the top indium phosphide layer in each of the regions thereby permitting independent electrical control over the light emitted by the pn junctions in each of the quaternary layers. A well is chemically etched into the surface of the indium phosphide substrate opposite to that of the epitaxial layers in order to facilitate the bonding of an optical fiber to the dual-wavelength light-emitting diode.

The electrical contacts in each of the regions lie in a single plane and, therefore, the device may be effectively heat sinked by bonding these contacts to independent electrical contacts of a heat sink. Since the epitaxial layer side of the substrate is the surface to which the heat sink is bonded, a much more efficient removal of the generated heat is accomplished. Consequently, the light-emitting junctions can be driven with higher currents in order to emit higher output powers at each of the output wavelengths.

BRIEF DESCRIPTION OF THE DRAWING

The invention will be more readily understood after reading the following detailed description in conjunction with the drawing wherein.

DETAILED DESCRIPTION

Figure 1:
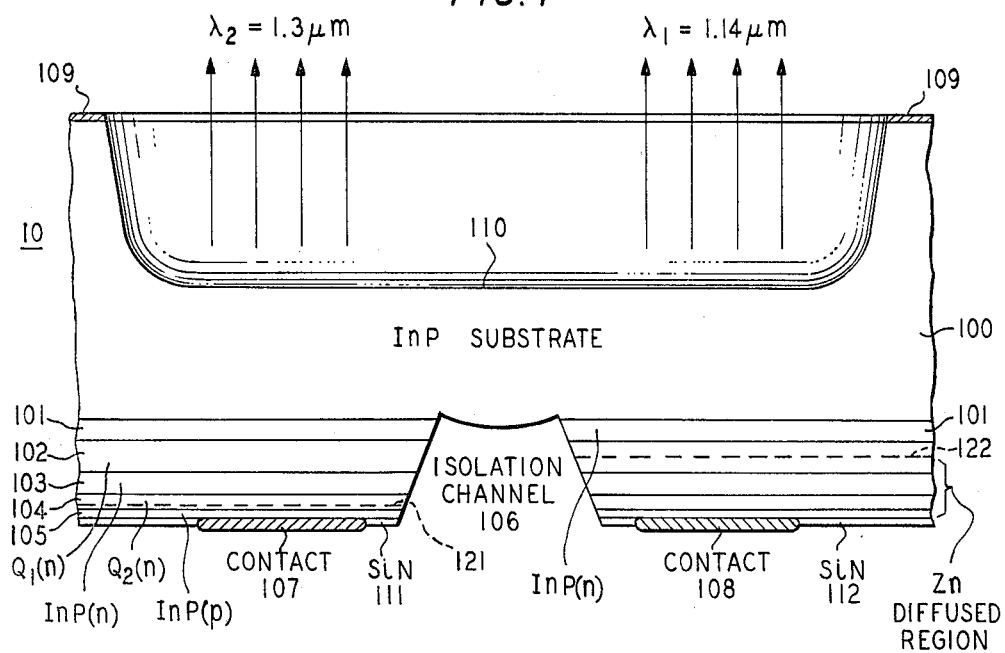
FIG. 1 is a cross section of a dual-wavelength light-emitting diode constructed in accordance with the present invention.

A dual-wavelength light-emitting diode 10 is constructed in accordance with the present invention by first growing an n-type indium phosphide buffer layer 101 on a heavily sulphur-doped, low-dislocation <100> indium phosphide substrate 100 as shown in FIG. 1. Subsequently, a two micrometer thick undoped n-type quaternary layer 102 is epitaxially grown on the indium phosphide layer 101. Layer 102 had the crystal composition corresponding to $In_{0.77}Ga_{0.23}As_{0.50}P_{0.50}$. An indium phosphide barrier layer 103 of the undoped n-type was then epitaxially grown on layer 102 with a thickness of about 1.5 micrometers followed by a 1 micrometer thick quaternary layer 104 of the undoped n-type having a crystal composition of $In_{0.66}Ga_{0.34}As_{0.75}P_{0.25}$. Finally, a zinc doped p-layer 105 of indium phosphide was epitaxially grown over layer 104. The photoluminescence peak of the bottom quaternary layer 102 was measured at room temperature to have a wavelength of 1.14 micrometers while that of the top quaternary layer 104 was measured to have a wavelength of 1.29 micrometers.

After the epitaxial layers have been grown one-half of the device (the left half as viewed in FIG. 1) is covered by a silicon nitride diffusion mask 111 and a pn junction 122 is established in the bottom quaternary layer 102 (of the right half as viewed in FIG. 1) by exposing the unmasked portion of the device to a solution of zinc dopant thereby permitting deep zinc diffusion to be carried out in a sealed ampoule by the usual methods. A pn junction 121 already exists in the top quaternary layer 104 in the left half of the device by diffusion from p-type layer 105. The unmasked portion of the device is then also covered with a silicon nitride layer 112 and contact windows measuring 25×75 micrometers separated by approximately 25 micrometers are opened in the silicon nitride layers by a common photolithographic process. Gold-zinc contacts 107 and 108 were then electroplated in the windows and the contacts were alloyed by heating. A contact 109 is established with the n-side of the pn junctions by electroplating and alloying Sn-Ni-Au to the surface of substrate 100 that is opposite to the surface that supports the epitaxial layers.

The two pn junctions, one of them in quaternary layer 104 and the other in quaternary layer 102, are then isolated electrically by chemically etching an isolation channel 106 through the grown layers using a dilute Br-CH$_3$OH solution. This isolation channel physically separates the grown epitaxial layers into two separate regions, one of them having a pn junction 121 in quaternary layer 104 and the other having a pn junction 122 in quaternary layer 102 by virtue of the zinc diffusion. Finally, a well 110 is etched into the 60 micrometer thick substrate 100 through the n-contact 109 in order to provide access to the emitted light from both junctions. With the contacts 107 and 108 separated by 25 microns, a fiber having a core diameter of at least 75 micrometers may be mounted in well 110 in order to receive the output light generated by both junctions.

Figure 2:
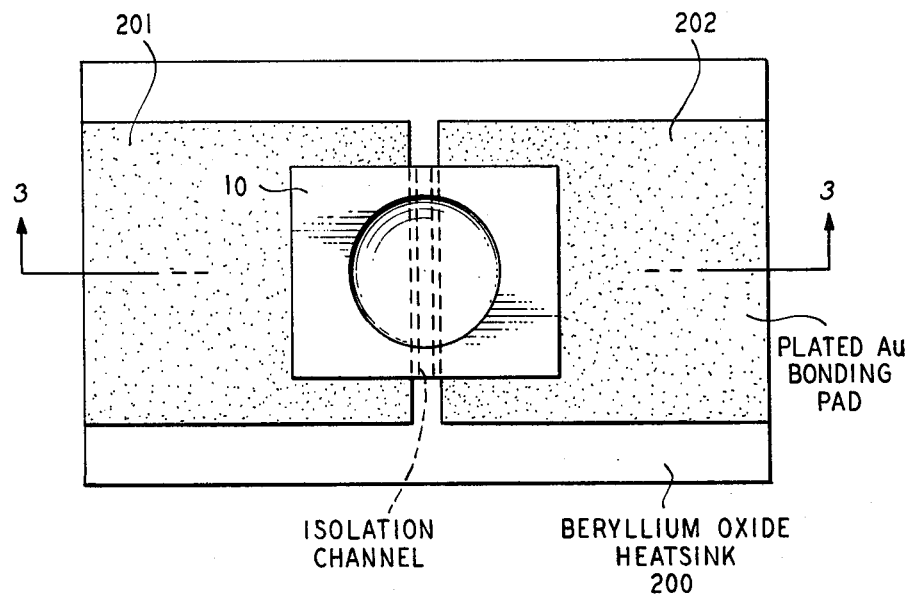
FIGS. 2 and 3 are top and side pictorial views of a dual-wavelength light-emitting diode constructed in accordance with the present invention and advantageously mounted on a beryllium oxide heat sink.
Figure 3:
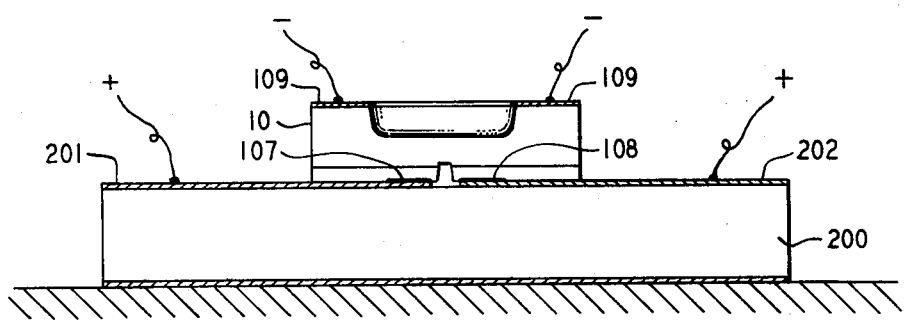

Since the device constructed in accordance with the present invention is a planar device on the epitaxial layered side of the substrate, this side may be advantageously mounted on a heat sink in order to effectively remove the heat generated by the light-emitting junctions. One such method of mounting this device is illustrated in FIGS. 2 and 3 of the drawing. As indicated in FIG. 2, a beryllium oxide heat sink 200 is prepared by plating gold onto one surface of the beryllium oxide heat sink to establish two electrically independent bonding pads 201 and 202. The device 10 from FIG. 1 is then mounted on the heat sink with the electrical contacts 107 and 108 soldered to bonding pads 201 and 202, respectively, as indicated in FIG. 3. Bonding pads 201 and 202 thereby provide means by which external connection can be established to each of the pn junctions in the light-emitting diode. The other side of the electrical connection for each of the pn junctions is, of course, provided by contact 109 on the well side of the device. The beryllium oxide heat sink 200 may, in turn, be bonded to a much larger heat sink surface as illustrated in FIG. 3. With this type of heat sinking on the epitaxial layered side of the device, it is expected that at least 1 milliwatt of output power can be obtained at each wavelength for a drive current of about 100 milliamps.

Figure 4:
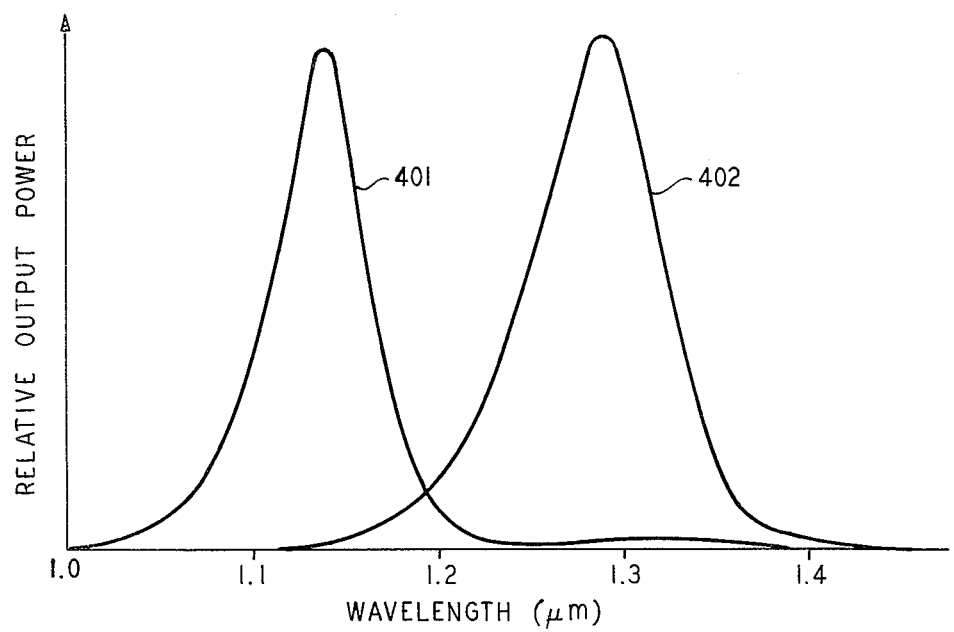
FIG. 4 is a plot of the output power versus wavelength for each region of the light-emitting diode constructed in accordance with the present invention.

The output spectra of the dual-wavelength light-emitting diode was measured by short circuiting one junction and driving the other. The resulting spectra are shown superimposed in FIG. 4 of the drawing. In FIG. 4 curve 401 represents the output power versus wavelength for the light emitted from the junction in quaternary layer 102 and curve 402 represents the output power versus wavelength for the light emitted from the junction in quaternary layer 104. As indicated in FIG. 4, the junction in layer 102 emits light that is centered about a wavelength of 1.14 micrometers and this junction also has a weak emission centered near 1.3 micrometers. The junction in layer 104 on the other hand appears to emit light that is centered only at a wavelength of about 1.3 micrometers. The secondary weak emission near 1.3 micrometers from the junction in layer 102 was relatively small about −16 dB optical (−32 dB electrical) below the primary emission at 1.14 micrometers and, therefore, this weak emission at the other wavelength should not contribute significantly to cross-talk. It is believed that this weak emission at 1.3 micrometers, when the junction in layer 102 is activated, is due to an absorption of the 1.14 micrometer radiation in the layer 104 with re-emission near 1.3 micrometers.

What has been described hereinabove is merely an illustrative embodiment of the present invention. Numerous departures may be made by those skilled in the art without departing from the spirit and scope of the present invention. For example, other crystal compositions may be used in the quaternary layers in order to achieve the emission of light at other wavelengths. Specifically, it should be understood that although the term quaternary has been used throughout the specification in order to describe the layers that include the pn junction, these layers may, in fact, only use three primary materials, indium, gallium and arsenic, thereby providing emission from one of the regions at the longest available wavelength in the InGaAsP materials system.

We claim:

1. A planar light-emitting diode comprising
   an n-type indium phosphide body,
   a first electrical contact to said body, and
   a plurality of epitaxial layers grown on said body, characterized by
   a first quaternary layer having an initial n-type conductivity,
   a p-type indium phosphide layer on said first layer and a first pn junction in said first layer,
   said plurality of layers further includes a second quaternary layer initially having n-type conductivity,
   said second layer being positioned between said body and said first layer,
   said plurality of layers being physically separated, by means of an isolation channel, into at least two separate regions each including a single p-n junction,
   one of said regions being diffused with a p-type dopant so as to form a second pn junction in said second quaternary layer, and
   a second electrical contact to said p-type indium phosphide layer in each of said regions.

2. A light-emitting diode as defined in claim 1 wherein said second quaternary layer is composed primarily of the elements indium, gallium, arsenic and phosphorous.

3. A light-emitting diode as defined in claim 2 wherein said first and second quaternary layers are separated by an indium phosphide barrier layer.

4. A light-emitting diode as defined in claim 3 wherein the p-type dopant is zinc.

5. A planar light-emitting diode comprising an n-type indium phosphide body, an electrical contact bonded to said body, at least two physically separate regions of epitaxial layers grown on said indium phosphide body, each of said two regions having a single pn junction and a top and bottom quaternary layer separated from one another with said bottom quaternary layer being closer to said body than said top quaternary layer, a top indium phosphide layer of p-type conductivity in each of said two regions epitaxially grown on said top quaternary layer to form a pn junction in said top quaternary layer of one of said regions, the other of said two regions having a diffused p-type dopant to form a pn junction in said bottom quaternary layer, and an electrical contact bonded to said top indium phosphide layer of p-type conductivity in each of said two regions.

6. A light-emitting diode as defined in claim 5 wherein said bottom quaternary layer in each of said two regions is composed primarily of the elements indium, gallium, arsenic and phosphorous.

7. A light-emitting diode as defined in claim 6 wherein said top and bottom quaternary layers are separated by an indium phosphide barrier layer.

8. A planar light-emitting diode comprising an n-type indium phosphide body, an electrical contact bonded to said indium phosphide body, at least two separate regions of physically separate epitaxial layers on said indium phosphide body, said two separate regions each having a single pn junction and an equal number of epitaxial layers including at least top and bottom quaternary layers separated from one another with said bottom quaternary layer being closer to said body than said top quaternary layer, one of said regions having a top indium phosphide layer of p-type conductivity in contact with said top quaternary layer thereby forming a pn junction in the top quaternary layer in one of said regions, the other of said two regions having a top indium phosphide layer with p-type conductivity and a diffused p-type dopant to form a pn junction in said bottom quaternary layer, and an electrical contact bonded to the top indium phosphide layer in each of said at least two regions.

9. A light-emitting diode as defined in claim 8 wherein said bottom quaternary layer is composed primarily of the elements indium, gallium, arsenic and phosphorous.

10. A light-emitting diode as defined in claim 9 wherein said top and bottom quaternary layers are separated by an indium phosphide barrier layer.

* * * * *